(12) United States Patent
Suh

(10) Patent No.: US 6,226,207 B1
(45) Date of Patent: May 1, 2001

(54) SEMICONDUCTOR DEVICE HAVING AN ELECTRIC CHARGE AMPLIFIER FOR AMPLIFYING BIT LINE ELECTRIC CHARGE

(75) Inventor: Jung Won Suh, Kyoungki-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/099,766

(22) Filed: Jun. 19, 1998

(30) Foreign Application Priority Data

Jun. 20, 1997 (KR) .................................. 97-26187

(51) Int. Cl.$^7$ ...................................... G11C 7/00
(52) U.S. Cl. .......................... 365/190; 365/205; 327/51
(58) Field of Search .................... 365/190, 205; 327/51

(56) References Cited

U.S. PATENT DOCUMENTS

| | | | |
|---|---|---|---|
| 4,716,550 | 12/1987 | Flannagan et al. | 365/207 |
| 4,803,386 | * 2/1989 | Kraus et al. | 257/57 |
| 4,855,628 | * 8/1989 | Jun | 257/57 |
| 4,858,195 | * 8/1989 | Soneda | 365/205 |
| 5,091,885 | 2/1992 | Suh | 365/209 |
| 5,241,503 | * 8/1993 | Cheng | 365/205 |
| 5,311,469 | 5/1994 | Hoshi et al. | 365/189.05 |
| 5,412,605 | 5/1995 | Ooishi | 365/203 |
| 5,528,543 | 6/1996 | Stiegler | 365/207 |

FOREIGN PATENT DOCUMENTS

| | | |
|---|---|---|
| 0 020 928 A1 | 1/1981 | (EP) . |
| 0 136 022 A2 | 4/1985 | (EP) . |
| 1 495 063 | 12/1977 | (GB) . |
| 2 312 978A | 11/1997 | (GB) . |

\* cited by examiner

*Primary Examiner*—David Nelms
*Assistant Examiner*—Hoai V. Ho
(74) *Attorney, Agent, or Firm*—Jacobson, Price, Holman & Stern, PLLC

(57) ABSTRACT

In a dynamic random access memory (DRAM) being operated at a low power-supply voltage, a bit line sense-amplifier for amplifying the electric charge first amplifies a cell charge applied to a bit line with a sufficient potential difference, prior to sensing the cell charge in a bit line sense-amplifier, thereby stably and quickly performing a sensing operation. In a semiconductor memory device having a cell array block having a plurality of memory cells, and a bit line sense-amplifier for sensing and amplifying a cell charge transmitted to a true bit line or a complement bit line, a bit line sense-amplifier for amplifying the electric charge includes: an electric charge amplifier which amplifies the cell charge transmitted to the true bit line and the complement bit line with a sufficient potential difference, and then transmits the amplified cell charge to the bit line sense-amplifier; and a switching element which is connected to the true bit line and the complement bit line between the cell array block and the electric charge amplifier, and switches a connection between the cell array block and the electric charge amplifier.

8 Claims, 7 Drawing Sheets

SEMICONDUCTOR DEVICE HAVING AN ELECTRIC CHARGE AMPLIFIER FOR AMPLIFYING BIT LINE ELECTRIC CHARGE

BACKGROUND OF THE INVENTION

1. Field of the Invention

The present invention relates generally to a dynamic random access memory (DRAM) being operated at a low power-supply voltage. More particularly, it relates to a bit line sense-amplifier for amplifying the electric charge which first amplifies a cell charge applied to a bit line with a sufficient potential difference, prior to sensing the cell charge in a bit line sense-amplifier, thereby stably and quickly performing a sensing operation.

2. Description of the Related Art

Generally, as a degree of integration of DRAM increases, an internal power-supply voltage becomes lowered so as to reduce the power-consumption and to ensure a reliability of the memory element. The following table shows a tendency in the power-supply voltage being used in the integration of each DRAM.

| DRAM integration degree | 64 Mb | 256 Mb | 1 Gb | over 4 Gb |
|---|---|---|---|---|
| power-supply voltage | 3.3 V | 2.5 V | 1.5 V | below 1.2 |

Therefore, in order to use a low power-supply voltage and to reduce the size of a chip, the number of cells connected to a bit line becomes increased in the new DRAM. Accordingly, a bit line signal's voltage being generated when a cell charge is transmitted to the bit line becomes lowered.

Even if a bit line signal ranges from 200 mV to 300 mV in a conventional DRAM, the bit line signal is reduced to about 100 mV in a gigabit DRAM. If the bit line signal is too low, a stable operation is not assured by an offset voltage of a sense-amplifier. Also, a high-speed operation is limited.

In the present invention, the electric charge stored in a cell capacitor is transmitted to a bit line in order to generate a bit line signal in an electric charge amplifier, and a sense-amplifier is operated after amplifying this bit line signal, thereby performing a stable and rapid sensing operation. Therefore, the present invention relates to a bit line sense-amplifier suitable to a memory operated at a low voltage.

In a DRAM memory using a cell having one transistor and one capacitor, a bit line signal (AVBL) can be obtained by the following equations.

Assumption: $VBLP = Vdd/2$, $\beta = CBL/CS$ (capacitance ratio), $\Delta VBL = (Vdd/2) \times (1/1+\beta)$ As known from the above equations, the bit line signal is determined by a power-supply voltage Vdd and the capacitance ratio $\beta$. Accordingly, since a power-supply voltage Vdd is at a low value in a DRAM of low voltage, the capacitance ratio $\beta$ should be lowered to maintain a magnitude of the original bit line signal.

In cases that the number of cells connected to a bit line remains the same evwn with the increase of the integration degree of DRAM, a cell capacitance Cs is between 20–25 fF with no change and a bit line capacitance CBL is lowered by a scaling. Thus a bit line signal's magnitude is maintained.

However, to reduce a size of a chip in a high integration DRAM, the number of cells connected to a bit line should be increased, so that a bit line signal becomes lowered as the power-supply voltage goes into a scaling down.

If the bit line signal is too low, it is difficult to make a stable sensing operation by an offset voltage of a bit line sense-amplifier. Furthermore, sensing speed is also reduced.

FIG. 1 is a circuit diagram of a conventional bit line sense-amplifier. If an electric charge stored in a cell capacitor CS is applied to a bit line by an actuation of a word line $WLi (1 \leq i \leq n)$, a voltage difference of a bit line signal $\Delta VBL$ occurs between bit lines BL and /BL. After a predetermined time, a signal SAP is to be a voltage Vdd, and a signal SAN is to be a voltage Vss, so that a sensing and rewriting operations are performed. In case of a precharging operation, a bit line equalization signal BLEQ is actuated, thereby the bit lines are precharged with a bit line precharge voltage VBLP. Since the conventional bit line sense-amplifier senses a bit line signal as it is, it may occur a malfunction at a low bit line signal.

SUMMARY OF THE INVENTION

The present invention is directed to a bit line sense-amplifier for amplifying the electric charge which substantially obviates the above-described problem due to limitations and disadvantages of the related art.

It is an object of the present invention to provide a bit line sense-amplifier for amplifying the electric charge which first amplifies a cell charge applied to a bit line with a sufficient potential difference, prior to sensing the cell charge in a bit line sense-amplifier, thereby stably and quickly performing a sensing operation.

In order to realize the above object, there is provided a semiconductor memory device having a cell array block having a plurality of memory cells, and a bit line sense-amplifier for sensing and amplifying a cell charge transmitted to a true bit line or a complement bit line, a bit line sense-amplifier for amplifying an electric charge which amplifies the cell charge transmitted to the true bit line and the complement bit line with a sufficient potential difference, and then transmits the amplified cell charge to the bit line sense-amplifier.

Further, in a semiconductor memory device having a cell array block having a plurality of memory cells, and a bit line sense-amplifier for sensing and amplifying a cell charge transmitted to a true bit line or a complement bit line, a bit line sense-amplifier for amplifying an electric charge includes:

an electric charge amplifier which amplifies the cell charge transmitted to the true bit line and the complement bit line with a sufficient potential difference, and then transmits the amplified cell charge to the bit line sense-amplifier; and a switching element which is connected to the true bit line and the complement bit line between the cell array block and the electric charge amplifier, and switches a connection between the cell array block and the electric charge amplifier.

DETAILED DESCRIPTION OF THE PREFERRED EMBODIMENT

Reference will now be made in detail to the preferred embodiment of the present invention, examples of which are illustrated in the accompanying drawings.

The following abbreviations are used in Figures in the present invention.

M1, M2, M3 and M4: MOS transistors making an electric charge amplifier;

Cx: capacitor making an electric charge amplifier;

Mx: MOS transistor making a capacitor;

Cs: cell capacitor;

VBLP: bit line precharge voltage;

Vcp: plate voltage of the cell capacitor Cs;

BLSA: bit line sense-amplifier;

BL and /BL: bit lines;

CBL: total capacitance of the cell capacitor Cs;

SB and /SB: bothe nodes of the bit line sense-amplifier in case that the bit lines are divided by a switch;

CSB: capacitance of the bode nodes SB and /SB of the bit line sense-amplifier;

WL: word line (WL1, WL2, ..., WLn−1, WLn);

Yj: output of a common column decoder, which selects a sense-amplifier and connects it to a data bus;

BLEQ: bit line equalization signal, which precharges a bit line with a VBLP voltage level;

SAN: source node of NMOS latch making the bit line sense-amplifier, which changes from VBLP to Vss, thus oeprating NMOS latch;

SAP: source node of PMOS latch making the bit line sense-amplifier, which changes from VBLP to Vss, thus operating PMOS latch;

BLS: signal for controlling the bit line switches M3 and M4; and

Qx: plate signal of a capacitor Cx (or Mx) coupled with a source node A (or A1, A2) of MOS transistors M1 and M2 making an electric charge amplifier.

Figure 1:
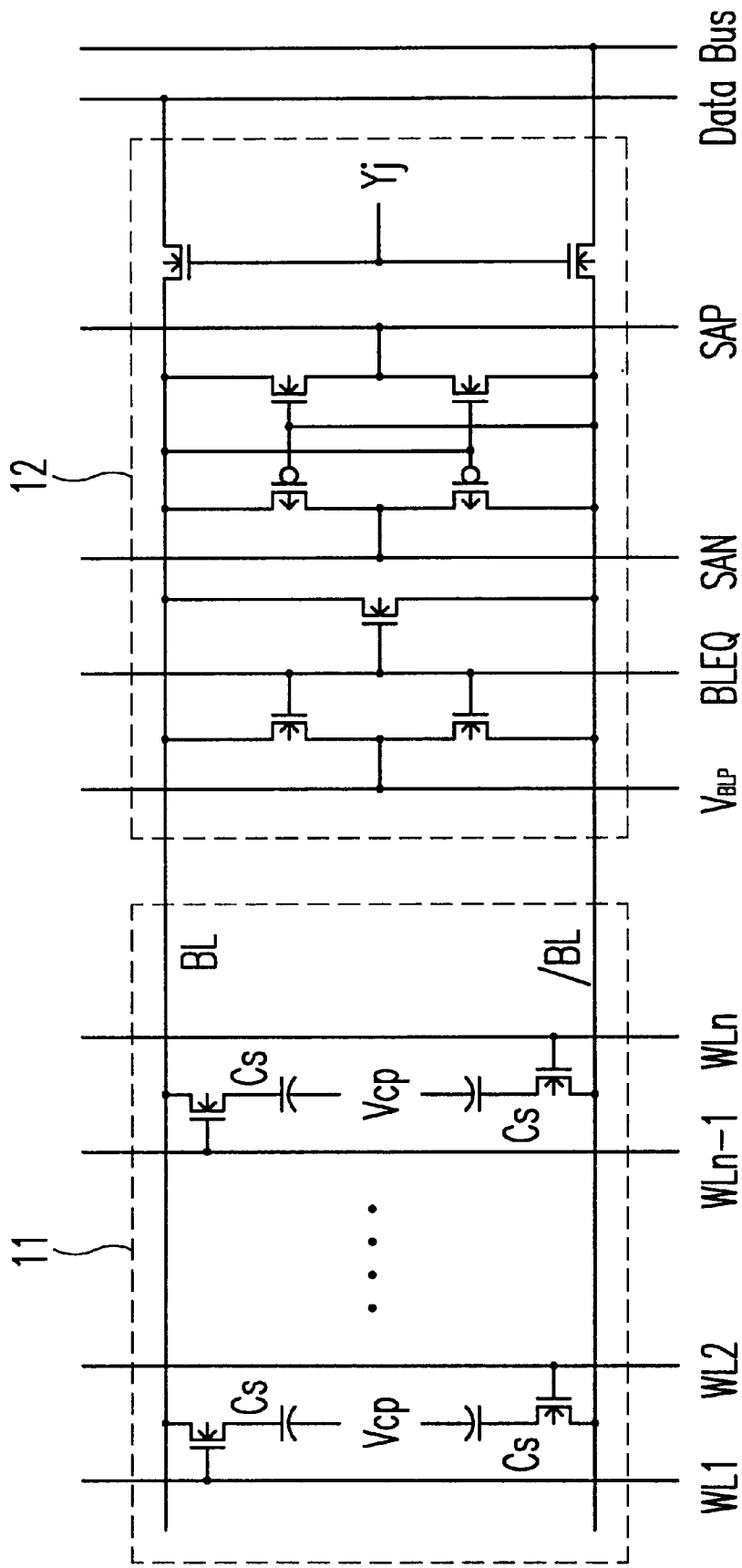
FIG. 1 is a circuit diagram of a conventional bit line sense-amplifier.
Figure 2A:
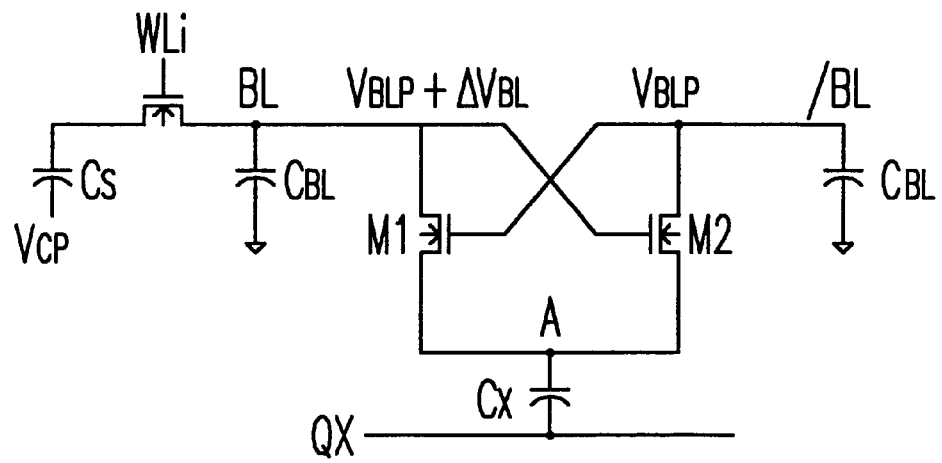
FIG. 2A is a conceptional diagram of an electric charge amplifier in accordance with the present invention.

FIG. 2A is a conceptional diagram of an electric charge amplifier in accordance with the present invention.

As shown in FIG. 2, there is an electric charge amplifier between a cell array and a bit line sense-amplifier. This bit line sense-amplifier amplifies a bit line signal ΔVBL which is produced by a transmission of a cell charge to a bit line. The electric charge amplifier is made of two transistors M1 and M2 and one capacitor Cx. The transistors M1 and M2 are made of a cross-coupled latch structure, a common source node A achieves a coupling by a plate signal QX and the capacitor Cx.

If the electric charge stored in a cell capacitor Cs is transmitted to a bit line BL by an actuation of a word line WLi, the bit line being precharged with 'VBLP' becomes changed to 'VBLP+ΔVBL'.

In the meantime, under a node A being a common source node of a cross-coupled latch is precharged with a predetermined voltage between 'VBLP' and 'Vss' in a precharging state, if the bit line voltage is changed to 'VBLP+ΔVBL' and the signal Qx of a high state Vdd is changed to a low signal Vss, a voltage of the node A coupled by the capacitor Cx drops. As a result, since the transistor M2 making a cross-coupled latch is first turned on, an electric charge sharing between a bit line /BL and the node A occurs, thereby amplifying a bit line signal ΔVBL.

If the bit line signal AVBL is at a negative value (−), the transistor M1 is first turned on, so that a electric charge is shared between the bit line BL and the node A.

Figure 2B:
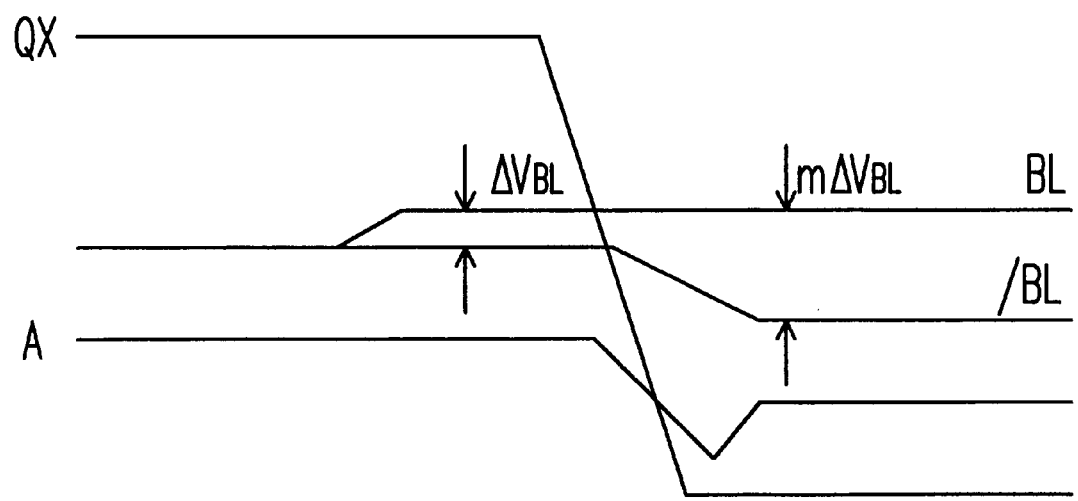
FIG. 2B is a waveform diagram of the operations of an electric charge amplifier in accordance with the present invention.

FIG. 2B is a waveform diagram of the operations of an electric charge amplifier in accordance with the present invention. As shown in FIG. 2B, as a voltage of the node A decreases by a coupling between the node A and the signal Qx, an electric charge sharing occurs between the node A and the bit line /BL, and the bit line signal ΔVBL is amplified to a signal mΔVBL (m>1).

Figure 3A:
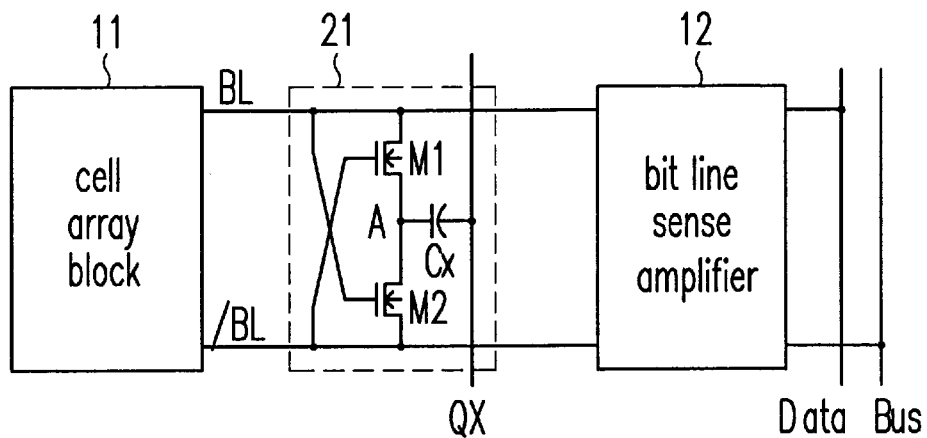
FIG. 3A is a circuit diagram of a bit line sense-amplifier for amplifying the electric charge in accordance with a first preferred embodiment of the present invention.

FIG. 3A is a circuit diagram of a bit line sense-amplifier (21+12) for amplifying the electric charge in accordance with the first preferred embodiment of the present invention.

The circuit shown in FIG. 3A includes:

a first transistor M2 positioned between a true bit line BL and a complement bit line /BL, of which a drain, gate and source are each connected to the complement bit line /BL, the true bit line BL and a node A;

a second transistor M1 positioned between the true bit line BL and the complement bit line /BL, of which a drain, gate and source are each connected to the true bit line BL, the complement bit line /BL and the node A; and a capacitor Cx which is coupled between node A and control signal.

The first and second transistors M2 and M1 are NMOS transistors. The capacitor Cx has the same structure as a cell capacitor, and is made simultaneously with the cell capacitor at the same time.

The control signal is changed to a power-supply voltage Vdd from a step-up voltage Vpp for a word line's actuation, thereby amplifying the electric charge.

According to a first preferred embodiment of the present invention, there is an electric charge amplifier 21 between a cell array 11 and a bit line sense-amplifier 12. A capacitor Cx of the electric charge amplifier 21 can be made simultaneously with making of the cell capacitor Cs.

Figure 3B:
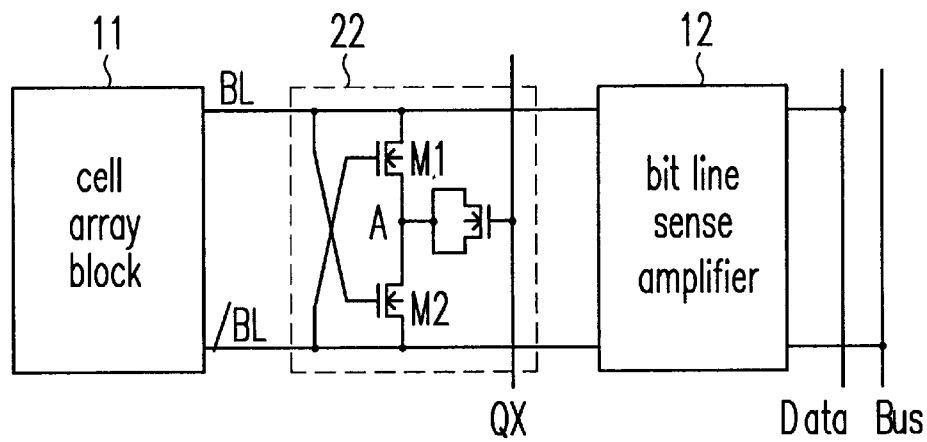
FIG. 3B is a circuit diagram of a bit line sense-amplifier for amplifying the electric charge in accordance with a second preferred embodiment of the present invention.

FIG. 3B is a circuit diagram of a bit line sense-amplifier for amplifying the electric charge in accordance with a second preferred embodiment of the present invention. Instead of the capacitor Cx of the first preferred embodiment, a gate capacitance of a MOS transistor Mx makes the capacitor. Because the capacitor is made of the MOS transistor, there is no difficulty in manufacturing the circuit shown in FIG. 3B.

Figure 3C:
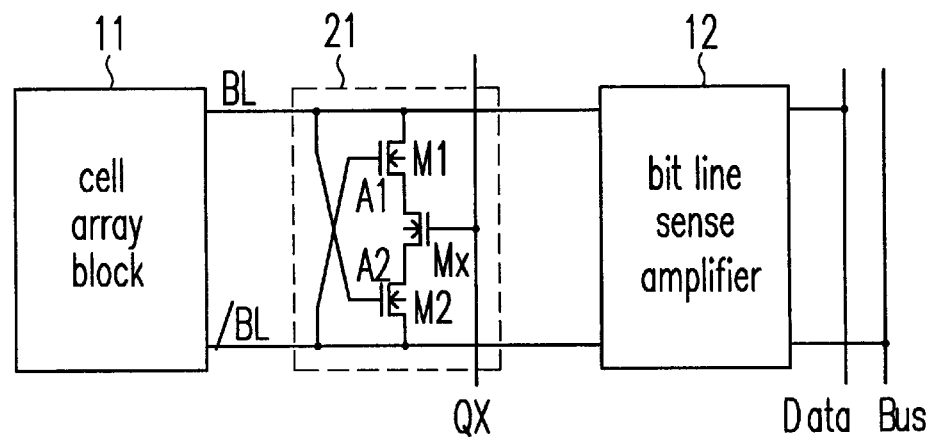
FIG. 3C is a circuit diagram of a bit line sense-amplifier for amplifying the electric charge in accordance with a third preferred embodiment of the present invention.

FIG. 3C is a circuit diagram of a bit line sense-amplifier for amplifying the electric charge in accordance with a third preferred embodiment of the present invention. As shown in FIG. 3C, the circuit includes:

a NMOS transistor M2 positioned between a true bit line BL and a complement bit line /BL, of which a drain, gate and source are each connected to the complement bit line /BL, the true bit line BL and a node A2;

a NMOS transistor M1 positioned between the true bit line BL and the complement bit line /BL, of which a drain, gate and source are each connected to the true bit line BL, the complement bit line /BL and the node A1; and a NMOS transistor Mx of which drain, gate an source are each connected to the node A1, a control signal and the node A2.

A connection of the NMOS transistor Mx constituting a capacitor of the electric charge amplifier 21 is different from that of FIG. 3B. A source node of the transistors M1 and M2 is shared with a source and drain of the transistor Mx, thereby reducing a layout area.

Figure 4:
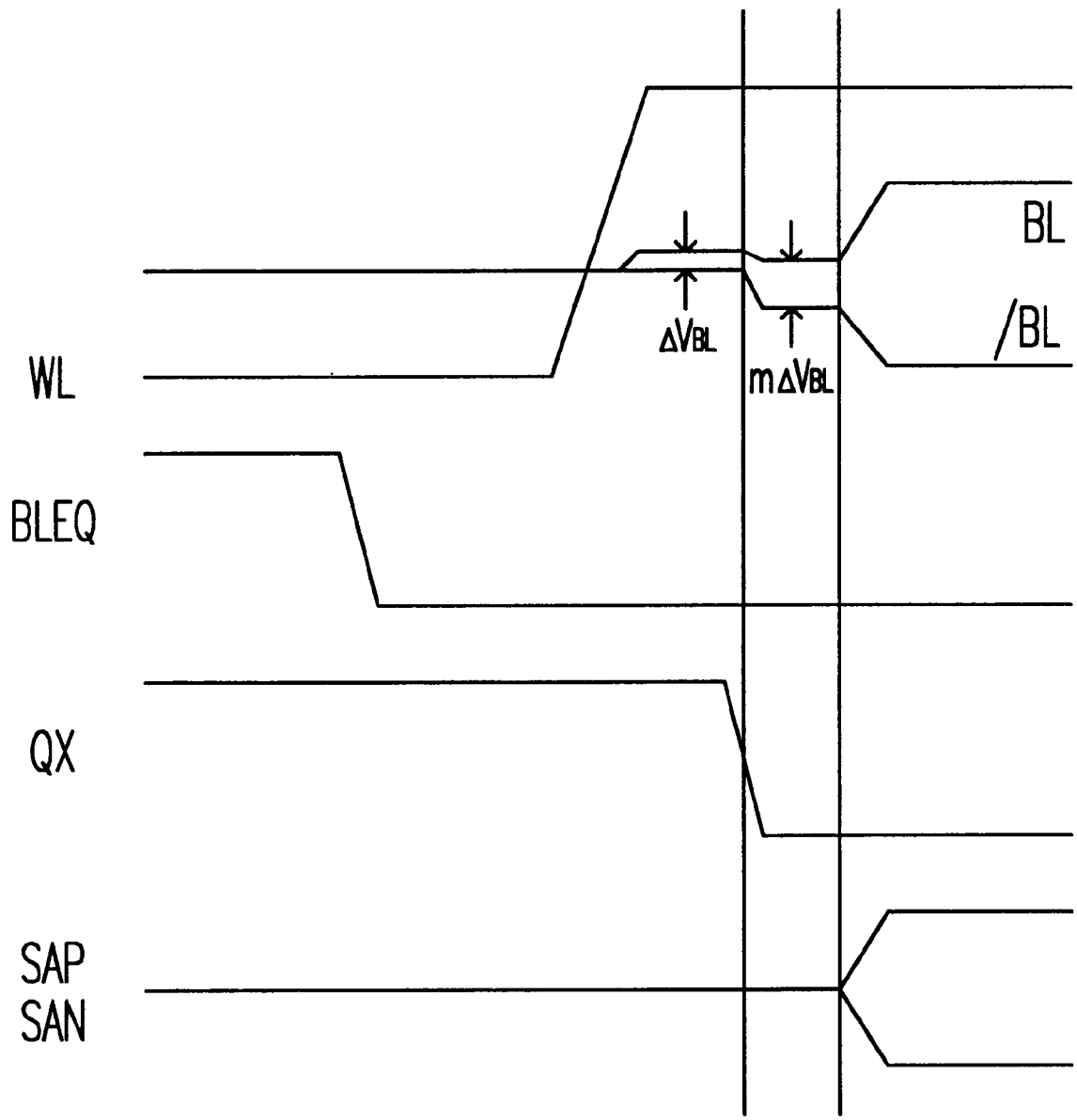
FIG. 4 is a timing diagram applied to FIGS. 3A–3C in accordance with the present invention.

FIG. 4 is a timing diagram applied to FIGS. 3A–3C in accordance with the present invention. Referring to FIG. 4, if the word line is actuated to 'Vpp' under the bit line signals BL and /BL are precharged with 'VBLP' by a bit line equalization signal BLEQ, a voltage of the bit line signal BL is changed by a cell charge as much as ΔVBL.

Then, if signal Qx is changed from 'Vss' to 'Vdd', an electric charge sharing occurs between the bit line /BL and the node A, so that a bit line signal is amplified to mΔVBL. As the signals SAP and SAN are each actuated as 'Vdd' and 'Vss', a sensing and rewriting operations are performed by a bit line sense-amplifier in the amplified bit line signal.

As shown in FIGS. 3B and 3C, since MOS capacitor Mx should be always turned on to achieve a coupling between the node A and the signal Qx, the signal Qx should be changed from 'Vpp' to 'Vdd' (or from 'Vdd' to 'VBLP').

Figure 5A:
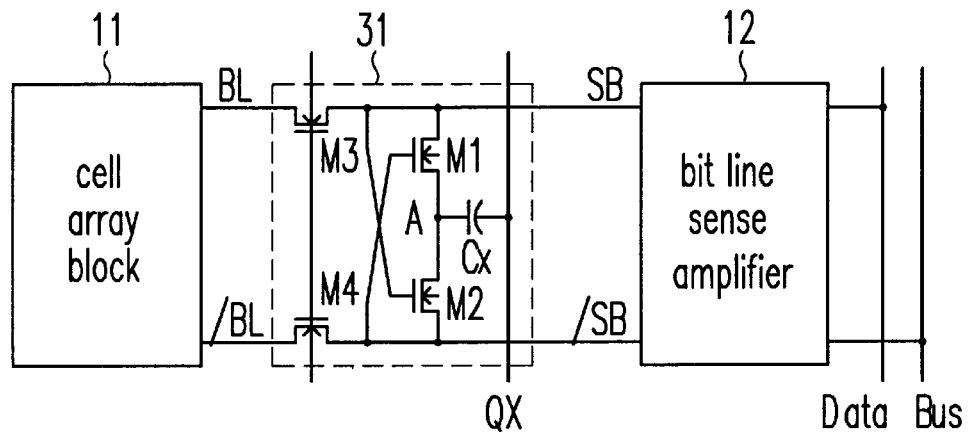
FIG. 5A is a circuit diagram of a bit line sense-amplifier for amplifying the electric charge in accordance with a fourth preferred embodiment of the present invention.

FIG. 5A is a circuit diagram of a bit line sense-amplifier for amplifying the electric charge in accordance with a fourth preferred embodiment of the present invention.

As shown in FIG. 5A, there are bit line switches M3 and M4 between a cell array block 11 and an electric charge amplifier 31, as compared with FIGS. 3A–3C. An electric charge sharing occurs between the bit line and node A when operating the electric charge amplifier 31, so that an electric charge amplification becomes greater as a capacitance of the bit line grows lower. Accordingly, in case that a bit line signal ΔVBL is generated by a cell charge and the electric charge amplifier 31 is then operated after a bit line switch is turned off, an electric charge sharing occurs between a signal /SB and the node A. This electric charge sharing is more effective to a charge amplification of the bit line signal, because of C/SB<C/BL. A capacitor Cx can be made with a cell capacitor Cs at the same time in the same way of FIG. 3A.

Figure 5B:
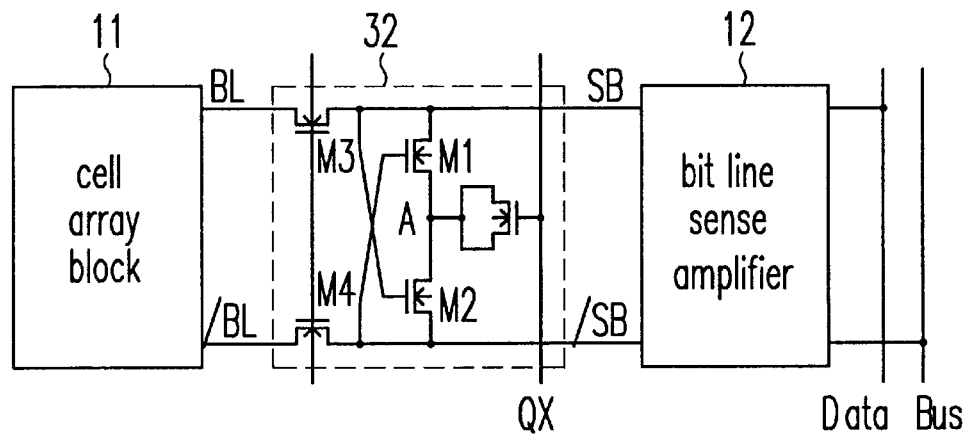
FIG. 5B is a circuit diagram of a bit line sense-amplifier for amplifying the electric charge in accordance with a fifth preferred embodiment of the present invention.

FIG. 5B is a circuit diagram of a bit line sense-amplifier for amplifying the electric charge in accordance with a fifth preferred embodiment of the present invention. As shown in FIG. 5B, a capacitor is constructed by a MOS transistor Mx's gate capacitance instead of the capacitor Cx of the electric charge amplifier 31. Since the capacitor is made of only MOS transistor, its fabrication can be easily embodied without any difficulty.

Figure 5C:
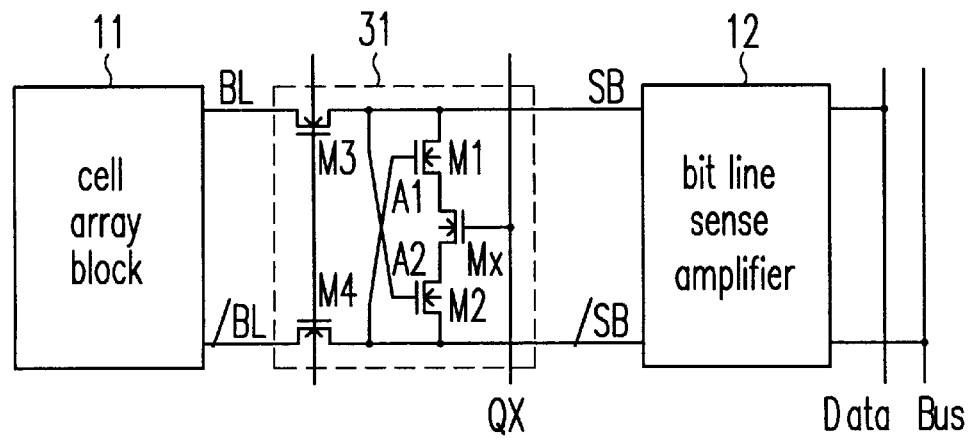
FIG. 5C is a circuit diagram of a bit line sense-amplifier for amplifying the electric charge in accordance with a sixth preferred embodiment of the present invention.

FIG. 5C is a circuit diagram of a bit line sense-amplifier for amplifying the electric charge in accordance with a sixth preferred embodiment of the present invention. A coupling structure of the MOS transistor Mx making the capacitor of the electric charge amplifier 31 is different from that of FIG. 5B. A source node of transistors M1 and M2 is shared with a source and drain of the MOS transitor Mx, thereby decreasing a layout area.

Figure 6:
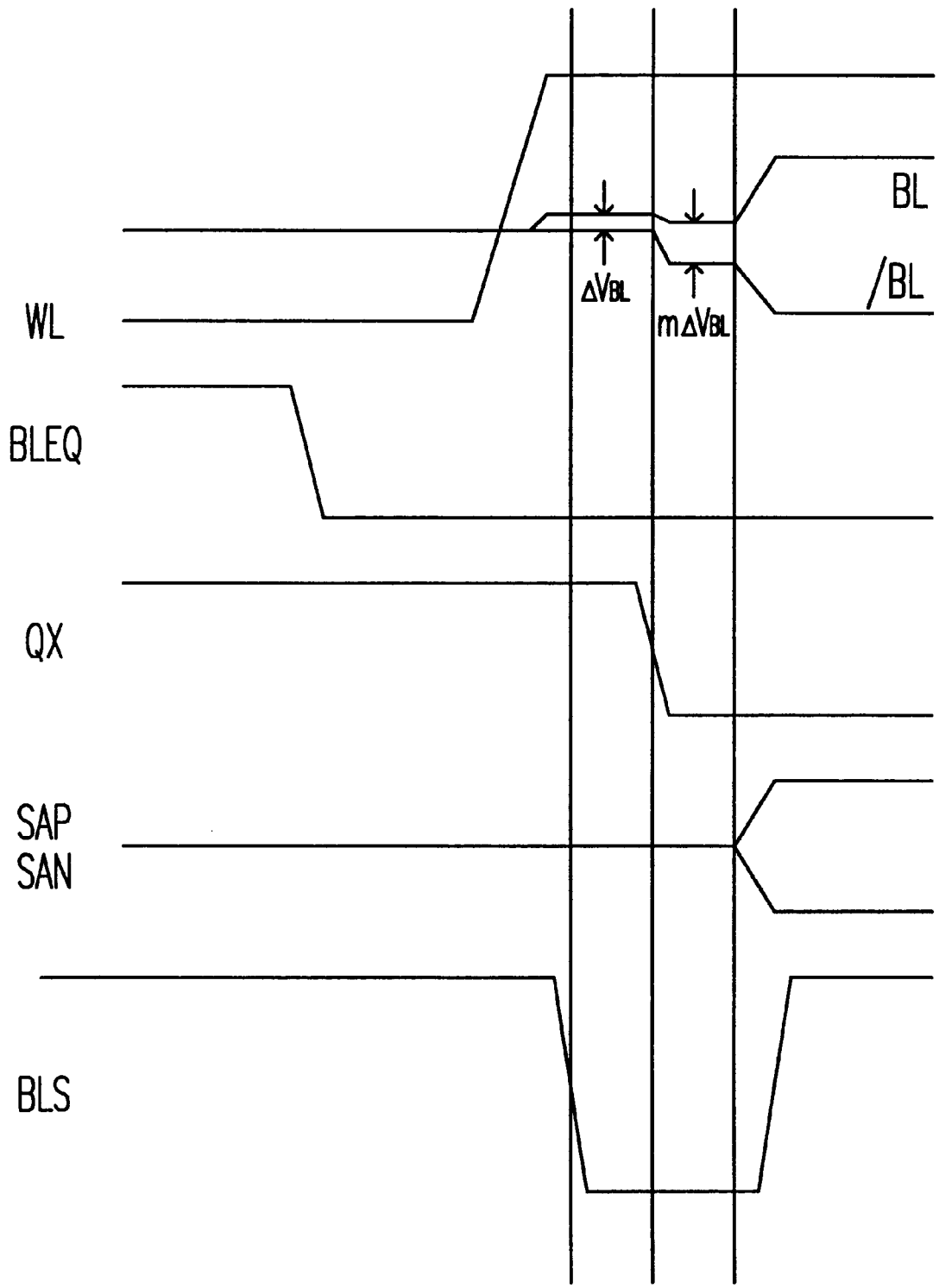
FIG. 6 is a timing diagram applied to FIGS. 5A–5C in accordance with the present invention.

FIG. 6 is a timing diagram applied to FIGS. 5A–5C in accordance with the present invention. If the word line is actuated to a step-up voltage 'Vpp' while the bit lines BL and /BL are precharged with 'VBL' by a bit line equalization signal BLEQs, a voltage of the bit line BL is changed as much as ΔVBL.

Then, if the bit line switches M3 and M4 are turned off by a signal BLS and the signal Qx is changed from 'Vdd' to 'Vss', a charge sharing occurs in between a signal /SB and the node A so that a bit line signal is amplified by mΔVBL (m>1). The amplified bit line signal is sensed by a bit line sense-amplifier as the signals SAP and SAN are each actuated as 'Vdd' and 'Vss'. After that, the bit line switches M3 and M4 are turned on by the signal BLS so that a rewriting operation is performed in the cell.

As shown in FIGS. 5B and 5C, since MOS capacitor Mx should be always turned on to achieve a coupling between the node A and the signal Qx, the signal Qx should be changed from 'Vpp' to 'Vdd' (or from 'Vdd' to 'VBLP').

Figure 7:
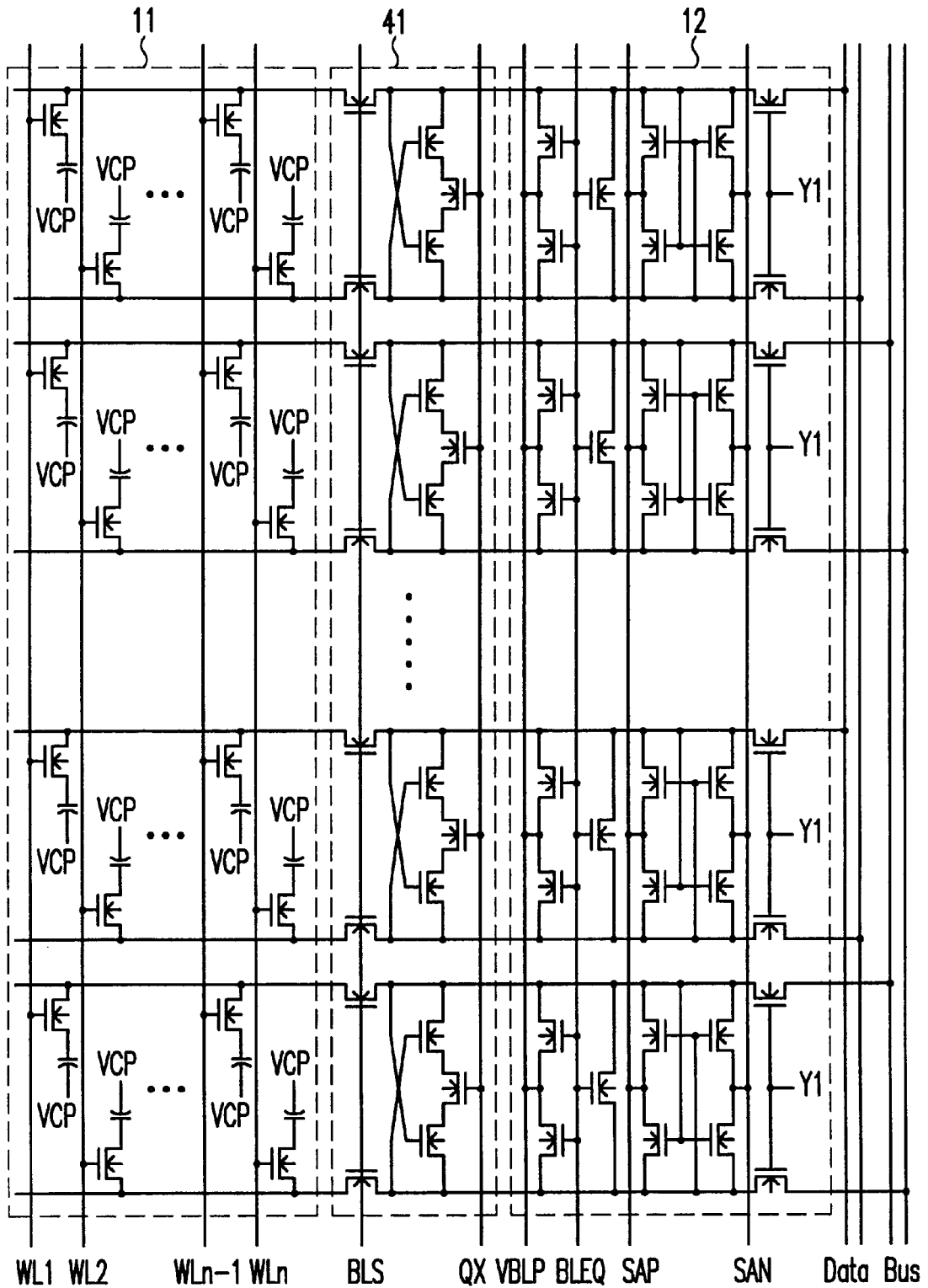
FIG. 7 shows an array structure of a bit line sense-amplifier for amplifying the electric charge in accordance with the present invention.

FIG. 7 shows an array structure of a bit line sense-amplifier for amplifying the electric charge in accordance with the present invention. As shown in FIG. 7, an electric charge amplifier is the same as the structure of FIG. 5C. A signal BLS and a signal Qx are shared in the sense-amplifier array, and the electric charge amplifier 31 is operated simultaneously with the sense-amplifier array. The remaining portions can be made in the same way of the conventional bit line sense-amplifier (BLSA) array. Particularly, in order to minimize an influence of a mismatch between the transistors, the electric charge amplifier 31 requires a careful attention to its layout and size in a fabrication process.

As described above, a bit line sense-amplifier for amplifying the electric charge in accordance with the present invention first amplifies a cell charge applied to a bit line with a sufficient potential difference, prior to sensing the cell charge in a bit line sense-amplifier, thereby stably and quickly performing a sensing operation at a low power-supply voltage. In addition, the number of cells connected to the bit line can be increased in the present invention, thereby decreasing the size of a chip.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A semiconductor memory device comprising:

a cell array block which has a plurality of memory cells;

a bit line sense-amplifier for sensing and amplifying a cell charge transmitted to a true bit line or a complement bit line; and an electric charge amplifier connected between the cell array block and the bit line sense-amplifier, for amplifying the cell charge transmitted to the true bit line or the complement bit line with a sufficient potential difference by using a capacitance component, and then transmitting the amplified cell charge to the bit line sense-amplifier, wherein the electric charge amplifier includes, a first transistor positioned between a true bit line and a complement bit line, of which a drain, gate and source are each connected to the complement bit line, the true bit line and a first node;

a second transistor positioned between the true bit line and the complement bit line, of which a drain, gate and source are each connected to the true bit line, the complement bit line and a second node; and a third transistor of which a drain, gate and source are each connected to the second node, a control signal and the first node.

2. The semiconductor memory device of claim 1, further comprising:

switching means, connected to the true bit line and the complement bit line between the cell array block and the electric charge amplifier, for switching a connection between the cell array block and the electric charge amplifier.

3. The semiconductor memory device of claim 2, wherein:

the switching element includes an n-channel metal oxide semiconductor (NMOS) transistor.

4. The semiconductor memory device of claim 1, wherein the first and second and third transistors include NMOS transistors.

5. The semiconductor memory device of claim 1, wherein:

the control signal is changed from a step-up voltage to actuate a word line to a power-supply voltage, thereby performing a charge amplification operation.

6. A semiconductor memory device having a cell array block which has a plurality of memory cells, and a bit line sense-amplifier for sensing and amplifying a cell charge transmitted to a true bit line or a complement bit line, further comprising:

an electric charge amplifier which amplifies the cell charge transmitted to the true bit line or the complement bit line with a sufficient potential difference, and then transmits the amplified cell charge to the bit line sense-amplifier, wherein the electric charge amplifier includes, a first transistor positioned between a true bit line and a complement bit line, of which a drain, gate and source are each connected to the complement bit line, the true bit line and a first node;

a second transistor positioned between the true bit line and the complement bit line, of which a drain, gate and source are each connected to the true bit line, the complement bit line and a second node; and a third transistor of which a drain, gate and source are each connected to the second node, a control signal and the first node.

7. The semiconductor memory device of claim 6, wherein the first to third transistors include NMOS transistors.

8. The semiconductor memory device of claim 6, wherein:

the control signal is changed from a step-up voltage to actuate a word line to a power-supply voltage, thereby performing a charge amplification operation.

* * * * *